(12) United States Patent
Elberbaum

(10) Patent No.: US 8,638,087 B2
(45) Date of Patent: Jan. 28, 2014

(54) APPARATUS FOR EMPLOYING LOW OHMIC ALLOY CONDUCTORS AND METHOD FOR SIMPLIFYING CURRENT DRAIN DATA RETRIEVAL

(75) Inventor: David Elberbaum, Tokyo (JP)

(73) Assignee: Elbex Video Ltd., Tokyo (JP)

( * ) Notice: Subject to any disclaimer, the term of this patent is extended or adjusted under 35 U.S.C. 154(b) by 40 days.

(21) Appl. No.: 13/349,939

(22) Filed: Jan. 13, 2012

(65) Prior Publication Data

US 2013/0183043 A1 Jul. 18, 2013

(51) Int. Cl.
*G01R 19/00* (2006.01)

(52) U.S. Cl.
USPC ................... 324/76.11; 324/127; 324/110

(58) Field of Classification Search
USPC ........................................ 324/123 R
See application file for complete search history.

(56) References Cited

U.S. PATENT DOCUMENTS

| | | | | |
|---|---|---|---|---|
| 5,811,966 | A * | 9/1998 | Lee | 324/157 |
| 7,639,907 | B2 | 12/2009 | Elberbaum | |
| 7,649,727 | B2 | 1/2010 | Elberbaum | |
| 7,864,500 | B2 | 1/2011 | Elberbaum | |
| 8,041,221 | B2 | 10/2011 | Elberbaum | |
| 8,148,921 | B2 * | 4/2012 | Elberbaum | 315/363 |
| 2010/0278537 | A1 * | 11/2010 | Elberbaum | 398/112 |
| 2011/0227510 | A1 * | 9/2011 | Elberbaum | 315/363 |
| 2011/0276289 | A1 * | 11/2011 | Park et al. | 702/62 |
| 2011/0311219 | A1 * | 12/2011 | Elberbaum | 398/13 |
| 2012/0262006 | A1 * | 10/2012 | Elberbaum | 307/112 |
| 2012/0313619 | A1 * | 12/2012 | Hurwitz et al. | 324/76.11 |

OTHER PUBLICATIONS

U.S. Appl. No. 12/963,876, filed Dec. 9, 2010. Specification and Drawings Attached.
U.S. Appl. No. 13/086,610, filed Apr. 14, 2011. Specification and Drawings Attached.

* cited by examiner

*Primary Examiner* — Arleen M Vazquez
*Assistant Examiner* — Alesa Allgood
(74) *Attorney, Agent, or Firm* — Katten Muchin Rosenman LLP

(57) ABSTRACT

Apparatus and method for measuring current drain and reporting power consumption using current transformer with primary windings made of low ohmic alloy, enabling the use of the secondary coil to power the sensing and reporting circuits eliminating the power wasted by AC-DC power adaptors used for the current sensors. The saving is substantial as the current sensors will not drain a current when the AC outlets are disconnected from a load or when the load is switched off. The apparatus using low ohmic alloy is extended to the structuring of terminals, including power pins, power sockets and combinations to provide a low ohmic sensing elements in AC plugs, outlets, adaptors and extension cables with multi outlets, dissipating the heat from the sensing elements by the plugs and the larger metal heat dissipation.

20 Claims, 6 Drawing Sheets

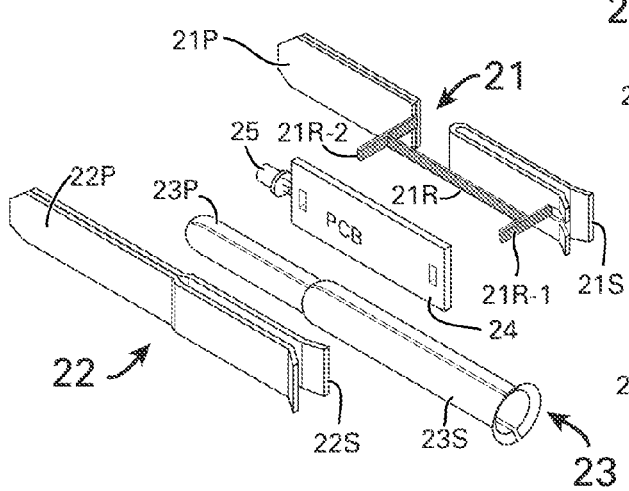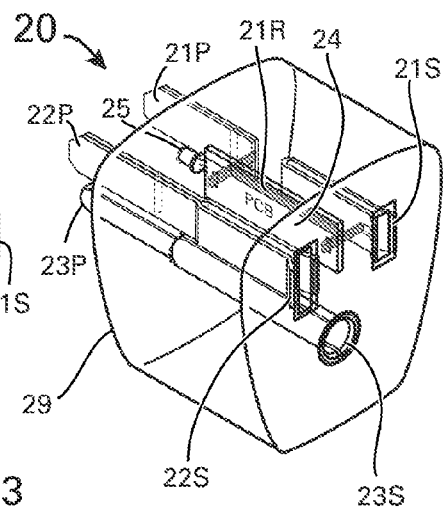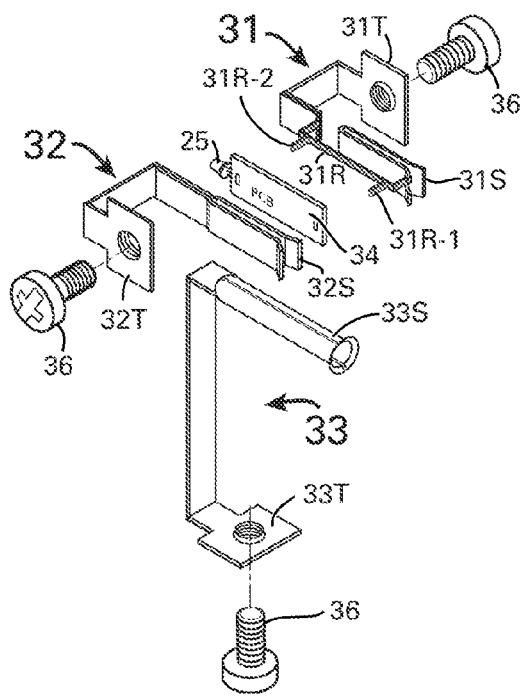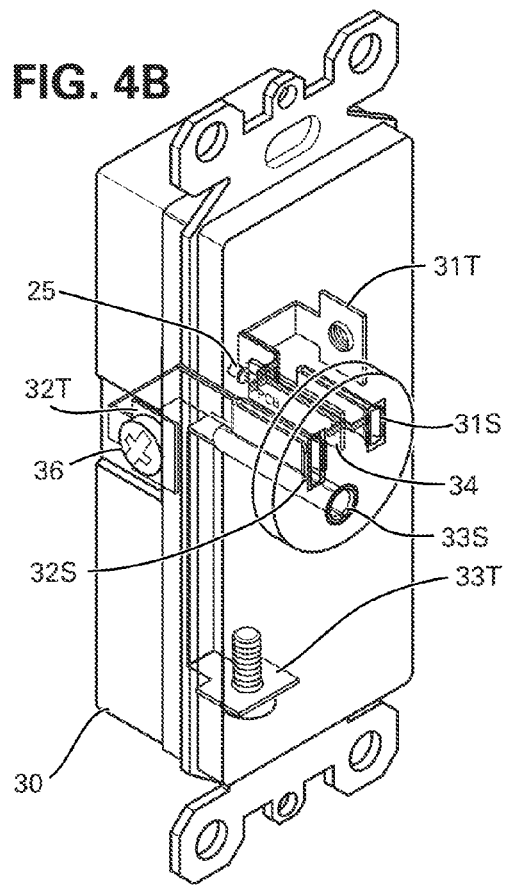

APPARATUS FOR EMPLOYING LOW OHMIC ALLOY CONDUCTORS AND METHOD FOR SIMPLIFYING CURRENT DRAIN DATA RETRIEVAL

FIELD OF THE INVENTION

AC current detecting elements for use in AC outlets and other electrical wiring devices for providing consumption data to users and to a smart grid of an electric power grid.

BACKGROUND OF THE INVENTION

Many different electrical wiring devices installed into the electrical circuits of premises, including residences, offices, businesses, factories, public buildings and other buildings require DC power whenever control circuits are used for the electrical wiring devices, including circuits used for measuring and communicating power consumption.

Electrical wiring devices for controlling LED lights, home automation switches and relays, controlled power outlets and environment control devices such as controls for heating, cooling, motorized window shades and curtains, installed into electrical wall boxes cannot be powered by a separate low voltage DC power lines, nor via a low voltage communication line. The electrical and building codes strictly prohibit the connections of low voltage bus-lines and/or the mingling low voltage wires with wall mounted AC power devices and/or with AC power lines in the same conduits. It would be similarly against the electrical and safety rules to connect low voltage communication wires to a current sensing adaptor, such as a plug-in adaptor for use with AC outlets of the present invention. Low voltage bus-lines cannot be directly connected to AC wiring devices for reporting to a controller the power consumed by an appliance.

This mandates the use of AC power supplies, internally built into electrical outlets, switches, relays, dimmers and the like. Such power supply may use AC transformers or large AC capacitors that are bulky and costly. Alternatively such small power supply may use power switching circuits that are costly and generate noise that must be suppressed by bulky filters.

Analog methods and devices to convert AC power to a low voltage and low current DC power are simple and generate very little noise, yet analog regulators waste substantial power and the resulting heat must be dissipated. The wasted energy by the analog regulator is far above the actual energy needed to power a control circuit of a given device to operate, particularly when the control circuits consumes very low power of few mW, or DC current of few mA and a low DC volt such as 5V, 3.3V or 1.8V for its operation.

Such low power consuming control circuits including controls for dimmers, current sensors, relays, power outlets and similar devices, using low power consuming CPU are disclosed in U.S. Pat. Nos. 7,639,907, 7,649,727, 7,864,500, 8,041,221, US publications 2010/0278537, 2011/0227510, 2011/0311219 and U.S. patent application Ser. Nos. 12/963,876 and 13/086,610 are incorporated herein by reference and are referred to hereafter as the reference patents, publications and applications.

The power wasted by the power supplies of AC power outlets or of a plugged-in power sensing adaptors incorporating power consumption detecting and communicating circuits are significant for the attempts by the global community to reduce the power consumption by monitoring the power consumed through power outlets in residences, commercial and industry use.

The current and power drain measuring and reporting circuit may drain few mW (milli Watt), but even if the power supply is efficient, the conversion of 120V or 230V AC into 1.8V/1 mA DC power will consume 1 W or more from the AC power line. Such continuous drain of power by, for example thirty power outlets and ten switches of a small residence, will waste energy of 40 W/hour or about 1 KW/day. This will occur even when not a single appliance or light is operated or even connected to the AC outlets. The accumulated wasted energy will therefore be over 365 KW/year by a small typical residence, such as a two small bedroom apartment. This is a significant consumption that must be resolved. A new small size low cost AC to DC power supply that does not waste energy is needed.

Common AC current sensors and current measuring elements include AC current transforms and coils for detecting current by induction, very low ohmic resistors such as 2 mOhm or 10 mOhm, for detecting the current passing through them by the level of voltage developing over the resistors terminals and magnetic hall sensors for detecting the magnetic flux by a current drain in a conductor.

The induction sensing element, the low ohm resistor element and the hall sensors present structural and assembling method difficulties that are not simple to solve. This directly affect the needed simplified low cost current sensing solution for reporting current consumption by appliances and other loads, and the accuracy of the very wide ranging unpredictable and randomly consumed power.

The low ohmic resistors used for AC current measurement are typical structured resistors, similar to the well known axial resistors or surface mounted resistors for mounting onto printed circuit board patterns. The axial resistors can be soldered onto terminals and other metal structure by a procedure that may affect the value of such small value resistances ranging for example from 2 mOhm~20 mOhm.

Further the low ohmic resistors need to be introduced for measuring higher currents ranging for example, from 5 A to 20 A or even higher, mandating PCB patterns that are wide end thick, or terminals that are large sufficiently to carry such heavy current without generating heat.

On the other hand the current transformers for detecting the AC current by induction are made of larger coils and/or cores, for measuring low current such as few mA to increase the permeability and the magnetic flux for measuring few mA of current drain. This is to enable the current transformers to output signals that are measurable and/or can be differentiated from noise levels that are persistent in power lines and the AC wiring devices of the electrical system.

Therefore the use of prior methods, elements and components results in large and bulky units, difficult to introduce into small current sensor adaptors or into AC outlets and switches mounted into electrical wall boxes. The same applies to plug-in current sensors, they must be made to be esthetically and small in size to be pleasing and not large bulky obstructive device plugged-in the AC wall socket and onto decorative covers of such AC outlets.

The hall sensors used for AC current sensing are small and accurate but require some 40~100 mW (5-10V and 8-10 mA) to operate, which contradict the need to minimize the wasted power by the current sensing circuit itself, the power supply and the wasted power by the AC current detecting devices. Here too another solution is needed.

SUMMARY OF THE INVENTION

The present invention solution for the structure of the current sensing resistors and current sensing coils or transformer is the introduction of current carrying wires and terminals made of conductive metals with low resistance such as brass and/or higher resistive metal alloys such as the known silver/nickel, nickel/copper, phosphor/bronze or similar alloys with low resistance.

The metal alloy in a wire form is to be used as the primary coil windings of a current transformer, or as a structured terminal processed and manufactured from a metal alloy sheet to enable the mechanical assembling of the socket terminals of an AC outlet or of a combination of a socket and plug of a plug-in current sensing adaptor. It can be similarly applied to the current sensing circuit by using the inherent resistance of a metal alloy structured as a socket or a pin or both for providing a low ohmic resistance for the detection of the current values through the measuring of the voltage develop over a portion of the structure as will be explained later.

The primary winding of a current transformer, onto a core such as toroidal core, C-core, E-core or any other core that can be small in size and provide for adequate winding of the primary and secondary coils as calculated. It is well known that high internal resistance of a transformer coil is reducing the Q factor of the coil and the transformer efficiency. Yet a primary coil of a small AC transformer for an AC line of 120V or 230V will be in the range of 100 ohm or more. The AC transformers are used commonly for reducing the AC line voltage into low voltage and therefore the number of turns of the primary coil windings in a commonly used AC transformer will be far larger than the number of turns in the secondary winding.

Without going into formulas and calculation details, the basic transformer calculation, i.e. the ratio of the number of turns of the primary to secondary winding is identical to the input/output voltage ratio. For example, a typical AC transformer, such as 120V to 12V, will have winding ratio of 10:1. In such an example if the number of windings of the primary coil is 1000, the secondary (the 12V) windings will be 100 only. The considerations for current sensing transformers are different.

The current transformers for power lines use a primary coil of very few winding or one only. Current transformers use the magnetic flux generated by the current drain through the primary coil, or by a wire extended through the center of a toroidal core, for outputting a lower current developed over a large number of turns in the windings of the secondary coil. For measuring power consumption through electrical wiring devices in a range of up to 2 KVA it is common for a secondary coil to consist of 1000~2000 turns or more, and even that is for outputting a very small signal level in the micro/milli volt range, corresponding to the current drain by a wire extended through the transformer core.

The internal resistance of a primary coil wire used in current sensing transformers is too small. Only non-resistive copper wire with thickness selected to provide for a specific values of current drain is used. The voltages developed, or the voltage drop over the internal resistance of such primary coil is normally ignored because the measured voltage drop is insignificant or even unmeasurable voltage, because it cannot be differentiated from the persistent noise in AC lines environment.

Further, there is an insignificant load connected to the secondary coil to induce an increased current in the primary coil and therefore the basics that apply to power transformers can only partially be applied to a current sensing transformer of the present invention as will be explained later.

The present invention uses several windings of low resistive wire, made of metal alloy, that provides higher resistance to the primary coil and thus a measureable voltage drop that can be measured in milli volts, for example, as high as 100 mV (0.1V) for a current drain of 1 A, and thus the internal resistance transform the primary coil by itself into an efficient current sensor, with a usable/measureable signal via the primary coil terminals. At the same time the developing voltage over the primary coil provide for a step up transformer for powering the current sensing, the power consumption processing and the communication circuits.

The present invention offers thereby a total solution to the power waste, first is by generating low AC voltage to equal the needed power by the sensor circuits with insignificant power loss and the second is, generating zero voltage and a zero power waste when no current is passing through the primary coil. In other words, zero power is consumed when the AC appliance is switched off, or no appliance is connected to the AC power outlet or to the current sensing adaptor.

The two terminals of the primary coil provide the sensor signal in the form of a voltage drop over the primary coil, caused by the internal resistance of the primary coil made of the metal alloy. The secondary coil output voltage is the product of the ratio of the small number of turns of the primary coil and the few hundreds or over a thousand winding turns of the secondary coil, and the voltage developing over the primary coil. Vout=Vin×ST/PT, where ST is secondary turns and PT is the primary turns.

Different considerations are introduced by the present invention, such as the alloy material, the current drain, the resistances and thickness of wires, the core size, the maximum magnetic flux and the efficiency losses at the primary/secondary coils.

Further calculations are the needed magnetic flux to generate the step-up voltage output by a small number of winding turns, the internal resistance of the primary coil and the minimal power needed by the circuits.

Because the current sensor circuit consume 6~10 mW only, the current transformer can be reduced to a very small size and provide the mW power units needed for the circuits, provide measurable sensor signal output and offer a perfect power saving solution with no waste, because as stated above, the circuit will operate only when a current is drained by a load. Even then the needed power remains a small fraction of 1 W.

In the following descriptions and the claims the references to an alloy wire, or to a low ohmic alloy as referred to a wire used for the primary coil windings of a current transformer or to a current sensing coil, are not intended to and do not limit the coil to only alloy wire or to a low ohmic wire. The reference to a primary coil or to a coil, as the case may be, comprises alloy wire and/or low ohmic alloy wire and/or combinations of alloy wire and copper wire as well as combinations of different alloy wires with or without copper wire or to copper wire only.

The term low ohmic alloy coil and the references to a number of turns of a coil for providing a given voltage drop and/or flux density can comprise any combination of wires including alloy wire and/or copper wire. Even though the following description may use the term alloy, alloy wire, low ohmic alloy, or low ohmic wire, the term such as coil made of low ohmic alloy wire, or made of alloy wire may include coil or primary coil made of wires comprising alloy and/or copper. Any reference to number of turns of a coil or of a primary coil may include a combination of a number of alloy wire winding turns and a number of copper wire winding turns or a number of copper only turns with a given low ohmic value.

Another object of the present invention is to provide a wider range of current sensing, thereby to enable the measuring of and the reporting of power consumption in watt units as low as 1 W and up to, for example, 2 KW. Considering the 120V AC, the 1 W will be the current measurement of approximately 8 mA while the current drain for 2 KW will be over 16 A. This is a very wide range that cannot be covered by a single current sensing resistor value. For example a current of 8 mA (1 W/120V) will develop a voltage of 80 micro volt over a 10 mOhm resistance and a current of 16 A (2 KW/120V) will develop a voltage of 0.16V. The power dissipation at the 16 A current will cause high heat (0.16V×16 A=2.56 W) and well above an acceptable maximum heat generation and cannot be considered for such application.

Accordingly several narrowed ranges are needed, such as 1 W to 50 W, 40 W to 300 W, 200 W to 800 W, 600 W to 1.2 KW, 1.0 KW to 1.5 KW and 1.3 KW to 2.5 KW as well as specific narrow band or range such as 2.4 KW 3.0 KW etc. The resistance of the primary coil metal alloy wire is selected according to the measuring range, the current drain and the AC power voltage applicable. In 120V power line, for the case of 1 W to 50 W range the resistance can be 0.2 ohm and the voltage developed over the resistor for a 1 W consumption (8 mA) will be 1.6 mV and for 50 W (416 mA) will be 83 mV, dissipating heat of a wasted 35 mW power, and well in the acceptable level.

Similarly in a 120V power line a current drain of 6.5 A (800 W) will develop a voltage drop of 0.013V over 2 mOhm resistance, a current drain of 10 A (1.2 KW) will develop a voltage drop of 0.020 V and power heat of 0.2 W, or 12.5 A (1.5 KW) will develop 0.012V over 1 mOhm (0.15 W power dissipation) and 20.83 A (2.5 KW) will develop 0.021V. The power dissipation of which will be 0.416 W, which is acceptable for the larger outlet (over 20 A) made for up to 3 KW power consumption. The values and ranges presented above are rounded, approximate values for explanation purposes only and are not the precise consumed power or current drain.

The AC current measurements differ from the measuring of power consumption, which must be based on measuring both, the current and the voltage curves, for resolving the phase shift caused by the appliances including their capacitance and/or motors inductance load values and/or the AC distortions caused by switching power supplies that are commonly used in electrical appliances.

Yet, another object of the present invention is to include a range selector on the basis of the current drained through the primary coil for improving the measuring accuracy and the signal to noise ratio by adjusting the current signal amplification. This is achieved by providing the secondary coil with multi windings that are serially connected, also known as secondary coil taps. Wherein the last winding or tap is designed to output a voltage level capable of powering the circuit at the lowest specified current drain value, and the first winding tap is designed to output a predetermined voltage level when an over current drain is detected. This is for alerting the user that the power consumed exceeds the measuring limit of the plug-in current sensing adaptor or the permissible power loading from the AC outlet.

The object of the invention to parcel the current drain measuring range can also be attained by a single secondary coil winding that is designed for the lowest designed current drain level as specified, and to parcel the measurement by detecting the AC voltage output level and operate the measurement circuit, including the adjustment of the sensor signal amplification that are explained later. The measurement of the secondary output voltage can also be used to alert or alarm the user to an excessive current drain passing through the current sensor.

Regardless of the method used, both methods the step method via multi secondary taps and the measurement of the output voltage of a single secondary coil are substantially simpler to use and apply, versus attempting to apply amplification control on the basis of the wide ranging sensor signals levels including micro and milli Volt signals developing across the primary coil.

The controller or the CPU of the measurement and communication circuit is preferably programmed to generate and communicate a change in the current status such as on-off or a change in the current drain value. To avoid a situation when the current is cut off by the user switching off an appliance at random, which promptly cuts the sensor circuit's power supply, a large low voltage storage capacitor is provided. The storage capacitor is continuously charged and keeps the charged energy to provide an extended time duration for the current sensor to communicate a change in the current drain including the switching off the load.

It is preferable that a CPU and the other circuits of the sensor will operate on a minute current, for example, such as below 1 mA, and that a large storage capacitor storing a low voltage such as 3.3V, powers the circuits that communicate and report the current drain, a change in the current drain, a current cut off and/or respond to queries by a system controller. The storage capacitor is charged to full capacity when the current is drained through the current sensor and its designed capacity depends also on the type of the communications signal employed, including RF, IR and optical signal for propagation data via lightguides or fiber optic cable, including plastic optical fiber known as POF and disclosed in the referenced US patents, publications and applications.

The other preferred embodiment of the present invention is the use of a selected metal alloy to form a designed terminal, referred to above as a power plug pin or a socket or a part of a combined pin and socket of a plug-in current sensing adaptor, for enabling the current sensor to be a part of such pin, socket or both. A significant advantage of such structure includes the cooling of the sensor by a power plug pin of an AC cable of an appliance, for example, a power cable assembly of an oven carrying high current to the oven is in physical/thermal contact with the socket that is formed or structured to be the sensing resistor. Such contact enables to disperse or dissipate the developing heat over the sensing resistor to the heavy pin plug including the connected copper core of the wire of the cable assembly, thereby dissipating and reducing the heat developed over the resistance structure of the socket terminal.

BRIEF DESCRIPTION OF THE DRAWINGS

FIG. 3A shows an exploded view of the pin-socket structures with the pin-socket of the live AC is made of alloy conductor structured to form a current sensing resistor of the preferred embodiment of the present invention;

FIG. 3B shows the assembly of the current sensor of FIG. 3A;

FIG. 4A shows an exploded view of an AC outlet socket with the live AC socket is made of alloy conductor and structured to form a current sensing resistor of the preferred embodiment of the present invention;

FIG. 4B shows the assembly of the AC outlet of FIG. 4A;

DETAILED DESCRIPTION OF THE PREFERRED EMBODIMENT

Figure 1A:
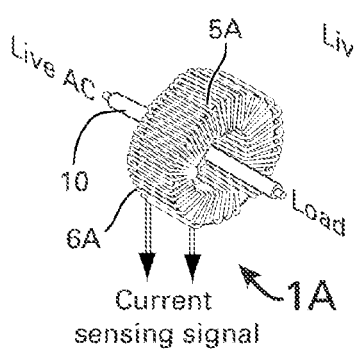
FIGS. 1A~1C are illustrative images of a toroidal and a C core coils of the prior art with access for current carrying wires and a circuit diagram of the current sensing of the prior art.

FIG. 1A shows a well known typical toroidal coil assembly 1A comprising a core 5A and windings 6A for sensing the AC current drained by the shown wire 10 extended through the center of the core 5A. The sensor coil output its current signal to a processor (not shown).

Figure 1B:
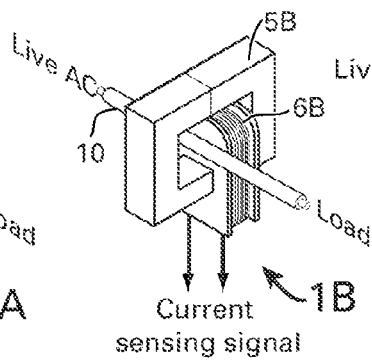

FIG. 1B shows another well known C core coil assembly 1B comprising the C core 5B with an access or a window and windings 6B for sensing an AC current drained by the shown wire 10 extended through the window for outputting a sensor signal to a processor (not shown).

Figure 1C:
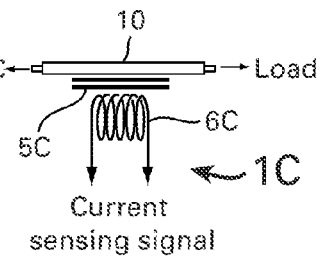

FIG. 1C shows a principal circuit diagram 1C of a core 5C and a coil 6C representing the coils 5A or 5B and the core 6A or 6B respectively, for sensing the AC current drained through the wire 10 and outputting current sensing signal from the coil 6C. The circuit is shown in FIG. 6B and is explained later.

Figure 2A:
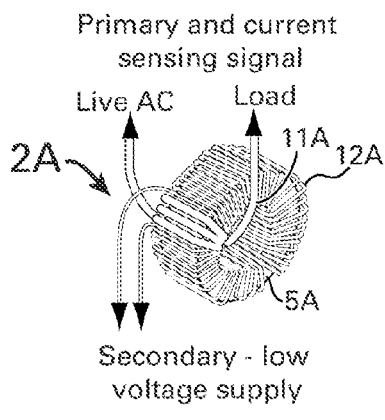
FIGS. 2A~2C show the coils and the circuit diagram of FIGS. 1A~1C modified to include a primary coil of the preferred embodiment of the present invention.

FIG. 2A shows a current sensor 2A which is a modified current sensor 1A wherein the current carrying wire 10 is replaced by a primary coil 11A. The primary coil is made of an alloy wire having a low ohmic resistance of several milli ohm for developing a voltage drop over the primary coil, corresponding to the current drained through the coil 11A. The voltage drop is used by the processing circuits to calculate the power consumption by a load or an appliance such as lights or a refrigerator, or an air conditioner and/or any other electrical appliance. The core 5A is a toroidal core identical with the core 5A of the current sensor 1A, the secondary coil 12A however is modified to output an AC voltage and a sufficient current for powering the processing and communication circuits shown in FIG. 6A, which will be explained later.

Figure 2B:
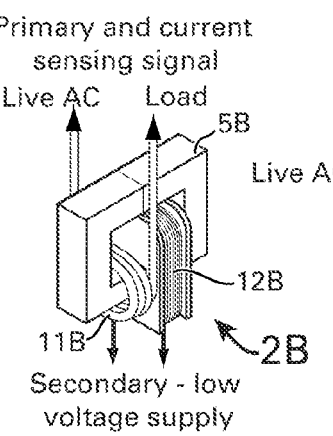

FIG. 2B shows a modified current sensor 2B, similar to the current sensor 1B shown in FIG. 1B, it uses the core 5B and structure, similar to the core 5A of the sensor 1B, replacing the wire 10 of the sensor 2B with a primary coil 11B that is made, similar to the primary coil 11A and refer to above, from a low ohmic alloy wire for developing a voltage drop proportional to the current drain through the primary coil 11B. The secondary coil 12B, similar to the secondary coil 12A, is designed to output an AC voltage with a sufficient current for powering the processing and communication circuits shown in FIG. 6A.

Figure 2C:
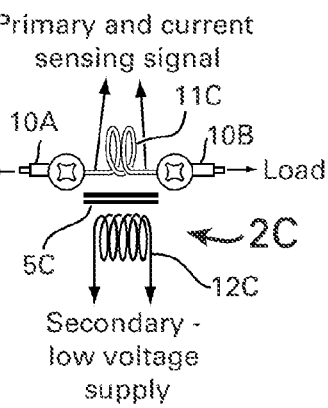

FIG. 2C shows the circuit diagram 2C of the current sensors 2A and 2B showing a core 5C, a primary coil 11C and secondary coil 12C representing both current sensors 2A and 2B, the circuit 2C is shown also in FIG. 6A that is explained later.

Figure 2D:
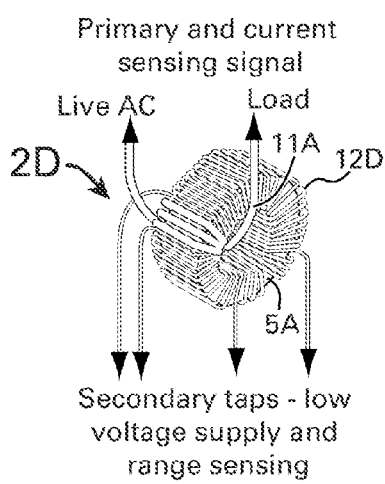
FIGS. 2D~2F show the current transformers of FIGS. 2A~2C modified by the introduction of multi secondary windings or multi output taps.
Figure 2E:
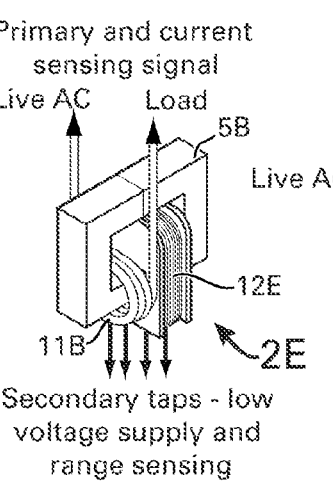
Figure 2F:
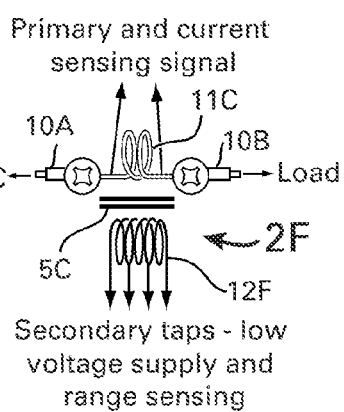
Figure 7A:
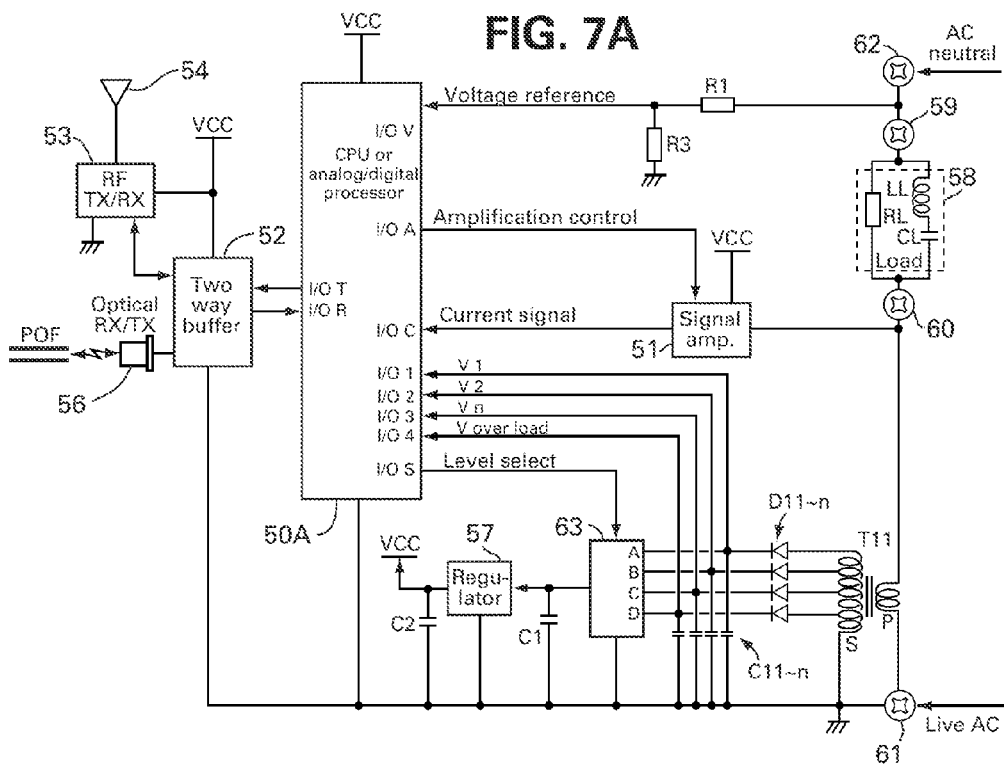
FIG. 7A is a block diagram similar to FIG. 6A expanded to include a range selector through the multi secondary coil taps of yet another preferred embodiment of the present invention.

FIGS. 2D, 2E and 2F show current sensors similar to the current sensors shown in FIGS. 2A, 2B and 2C with the exception of the secondary coils, that are shown here as multi windings or a secondary coil with multi taps, for providing range selection and control that is shown in FIG. 7A and will be explained later. Otherwise the structure of the core and the primary coils are identical with the cores and the primary shown in FIGS. 2A, 2B and 2C.

FIG. 3A shows an exploded view of the elements of a plug-in current sensing adaptor 20 for communicating current consumption comprising a combination 22 of a socket 22S and a plug pin 22P for the neutral power terminal, a combination 23 of a ground socket 23S and a plug 23P and a combination 21 of a socket 21S a plug 21P and a structured resistor 21R. The combination 21 is made of a low ohmic alloy such as brass, copper-nickel or silver-nickel or phosphor-bronze material or any other low ohmic metal alloy.

The resistor portion 21R is calculated to be a low ohmic resistor structure, including two formed integral terminals 21R-1 and 21R-2 that are solder terminals for supporting the printed circuit board 24. The PCB comprising the current and power consumption processing and communication circuits including the optical transceiver 25 for communication optical signals via a lightguide of fiber optic cable and the RF antenna 54 shown in FIGS. 6A~6C and 7A, and is structured in a form of a printed pattern onto the PCB board 24. The lightguide and the fiber optic cable and the optical transceiver are disclosed in the reference US patents, publication and applications.

FIG. 3B shows the mechanical assembly including the PCB 24 mounted onto the pin-socket combination 21, the neutral AC pin-socket combination 22 and the ground pin-socket 23 of the plug-in current sensor adaptor 20. The ground terminal has no function in the current drain detection and/or the current signal processing. FIG. 3B introduces the ground terminal to illustrate that the current sensing adaptor 20 is fully compliant with the electrical rules, codes and regulations governing ground connections.

The plug pins and sockets of the current sensing adaptor 20 are shown to be the US standards, but any other standard including the Great Britain standards, any of the different European standards, Australian standards or any other country standards for a structured pins and sockets or terminals can be complied with to provide current sensing adaptors that are in compliance with the dimensions, structure, codes and regulations governing electrical wiring devices. Similarly the plug-in current sensing adaptor 20 can be structured without the ground pin plug and socket 23 and its case or outer package 29 can be modified to fit 2 pin wall mounted AC outlet, without the ground terminal.

FIG. 4A is an exploded view of a wall mounted AC outlet socket terminals including the live AC terminal 31 made of a low ohmic resistance alloy and comprising the socket 31S, the terminal 31T for wire connection, the structured current sensing resistor 31R and the PCB mounting terminal 31R-1 and 31R-2. The shown PCB 34 is similar to the PCB 21 shown in FIGS. 3A~3B and so is the structured resistor 31R with its solder terminals 31R-1 and 31R-2. They are shown similar to the structured resistor 21R.

The structured resistors 21R and 31R can be structured in endless shapes, thicknesses, width, length, variations of which can be used to change the resistance values. The construction of the terminals, pins and sockets can be designed to meet cost targets, the terminals can be formed from a single thick cut sheet or a bended into multi-layer thin sheet, or punched, pressed or use riveted pieces of copper and low ohmic metal alloy combinations.

It is a cost effective solution to provide for different current drain ranges, when the only change between the AC outlets incorporating current sensor will be a change of the live AC terminal, structured for a given range of current drain or power consumption, along with a change in the AC outlet marking and/or the introduction of color codes to the AC outlets. This will identify the AC outlets that should be used or mated with an AC plug having identical markings or color codes.

For the above reason the structured resistors 21R and 31R are shown is to introduce a common shaped structure of a similar structure but, as referred to above, there are endless possibilities for the design of terminals, sockets and plugs to be structured, manufactured and assembled to provide a selected current sensing resistance. An example for such design is shown in FIGS. 5A~5F.

The other terminals of the wall mounted power outlet including the neutral terminal socket 32 and the ground terminal socket 33 are typical terminals used in power outlets shown as standard US power outlet, but can apply to power outlets of any country or region.

All other consideration for the PCB 34 including the communication circuit and the optical transceiver 25 are similar to the PCB 24 referred to in FIGS. 3A and 3B. The obvious change is seen by the removal of the plug pins 21P, 22P and 23P and replacing them with the shown screw terminals 31T, 32T and 33T. The ground terminal 33T and the ground socket 33S have no role in the circuits and structures referred to the present invention and they are shown to be compliant with grounding codes and rules. Power outlets with or without the ground terminals can be used by structuring a single or multiple AC power outlets with two terminal sockets per each outlet, the neutral and the live AC.

Shown in FIG. 4B is a single AC outlet assembly 30 combining the entire set-up of the exploded view shown in FIG. 4A, however such power outlets, wall mounted or other types, such as outlet adaptors or outlets combined with cable and plug assembly, having plurality or multiple of AC sockets that are in fact plurality of power outlets and each can be structured similar to the preferred embodiment, including the resistor 31R or other structure for providing a low ohmic sensing resistors to the live AC terminal. In many such multi AC outlets the neutral terminal sockets and the live AC terminal sockets are combined into a single structured bar, each bar is connected to a single neutral AC wire and a single live AC wire respectively for providing AC power to all the plurality of the AC outlet.

In such a set-up each of the live AC terminal sockets must be structured to include a low ohmic resistor such as the shown 31R or any other structure for each of the live AC terminal sockets. Same apply to power cable assemblies with multi power sockets and to the AC adaptors known as plug-in multi outlets adaptors. The PCB assembly for multi AC outlets can be a combined assembly with a single CPU or a single signal processor for all the plurality of sockets, including the reporting of the power consumption by each live AC socket terminal individually. The combined circuit shown in FIG. 7B will be explained later.

In the following description and the claims the term CPU (Central Processing Unit) refers to a CPU or to a DSP (Digital Signal Processor) or the any other signal processor be it analog to digital, digital to analog and any combinations of signal processing devices, ICs, and circuit packages.

Figure 5A:
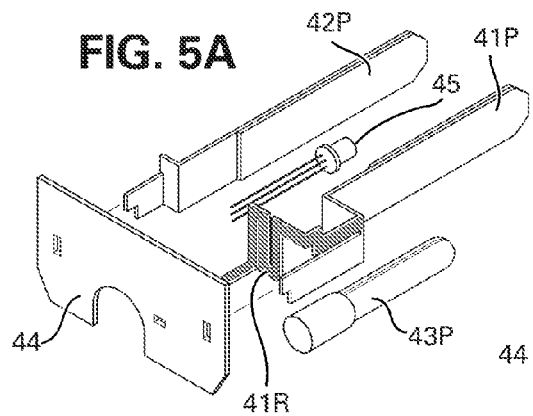
FIGS. 5A~5D are the front and rear exploded views of the pins and a PCB of an AC plug including the metal alloy structured resistor of the preferred embodiment of the present invention with FIGS. 5B and 5D show the assembled pins and PCB.
Figure 5B:
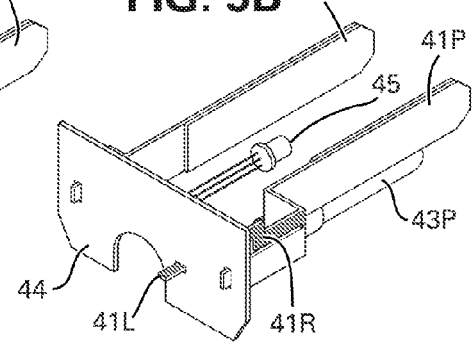
Figure 5C:
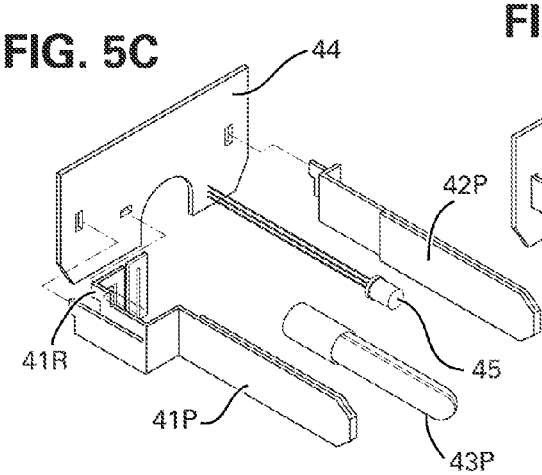

FIGS. 5A and 5C are the front and rear side of an exploded views showing the structure of power pin terminals 41P, 42P and 43P, which are the live AC pin, the neutral AC pin, and the ground pin respectively. The pins are similar to the pins 21P, 22P and 23P shown in FIG. 3A but the pins 41P and 42P are structured differently for mounting onto a rear PCB 44 and the ground pin 43P is structured for direct connection to a ground wire.

The resistor 41R is structured as a part of the pin 41P, but because of spacing limitation and the total size of the plug 40, the resistor 41R was formed in a shape of vertically elongated square wave cuts to provide the length needed to achieve the designed low ohmic resistance for a defined current drain through the AC plug 40.

The shown square wave shaped resistance is an example of the endless possibilities of designed shapes, thicknesses, width, length and the metal alloy selection for introducing a defined resistance, designed for measuring the current drained through a structured terminal, pin or socket and a combination thereof. The structured pins can be designed with solder pins, solder terminals holes, threaded holes and other structured shapes to install and connect the resistance portion to the PCB and the whole plug accurately and safely.

Figure 5D:
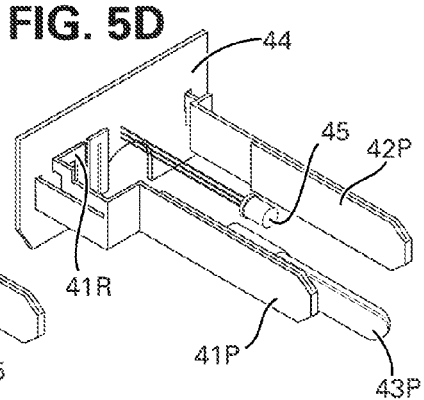
Figure 5E:
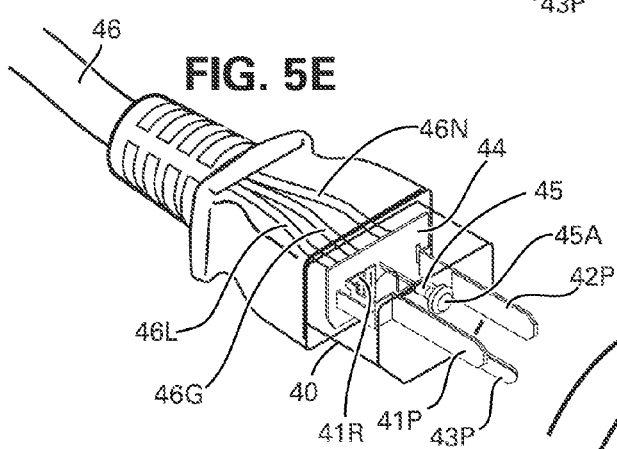
FIGS. 5E~5F show the overall assembly of the preferred embodiment plug comprising the pins and the PCB of FIGS. 5A~5D.
Figure 5F:
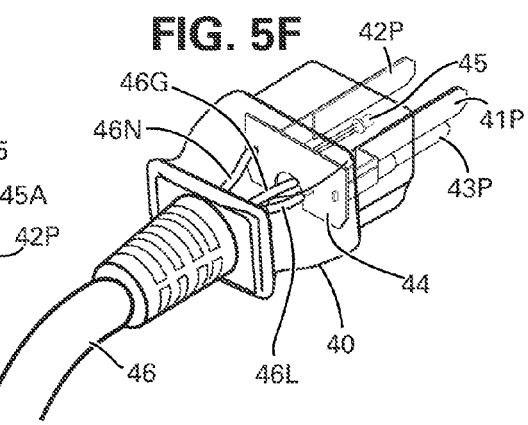

FIGS. 5B and 5D show the assembly of the pins 41P and 42P including the optical transceiver 45 onto the PCB 44. The ground pin 43P is not shown assembled or connected to the PCB, it has no specific function to provide, even though it can be used for shielding the circuit from noise. The ground wire 46G shown in FIGS. 5E and 5F is connected to the ground pin 43P. Not shown is the RF antenna 54 of FIGS. 6A~6C and 7A~7B for communicating two way RF signals, because such antenna is provided in the form of a small pattern onto the PCB itself and the PCB 44 therefore includes the antenna 54.

FIGS. 5E and 5F illustrate the molded plug 40, assembled and connected to the power cable 46 with its live AC wire connected to the load terminal 41L which is shown as a solder terminal of the resistor 41R, for connecting an appliance (not shown) to the other end of the power cable 46. This completes the introduction of the load resistor 41R in series between the AC live line via pin 41P and the appliance via the cable 46. The neutral wire 46N of the cable 46 is connected directly to the terminal 42P and as referred to above, the ground wire 46G is connected directly to the ground pin 43P and not to the PCB.

The shown optical transceiver communicates optical signals to a lightguide or fiber optical cable, which is disclosed in the referenced US patents, publications and applications as accessed via an optical access or an optical port of an AC outlet for propagating data pertaining current drain, power consumption and the load or the appliance particulars. The other way of the two way communications include inquiries by the system controller and commands for operating the appliance.

Figure 6A:
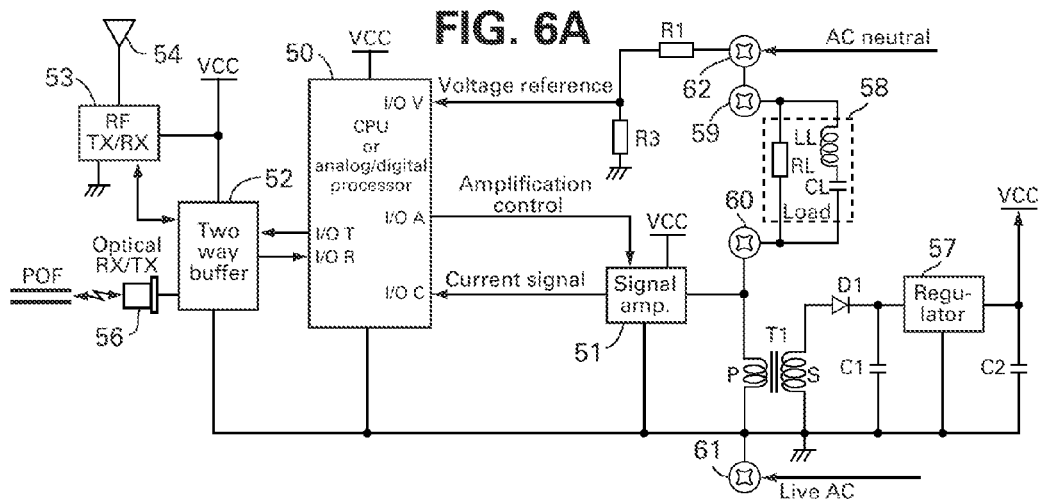
FIG. 6A is a block diagram of the current sensing and power consumption reporting circuit including the powering of the circuits by the current sensing transformer of the preferred embodiment of the present invention.
Figure 6B:
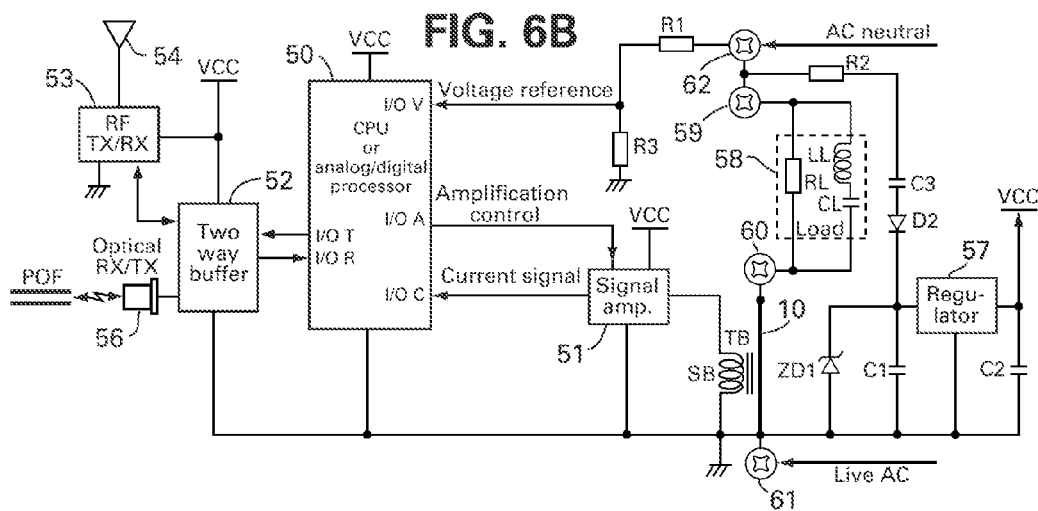
FIG. 6B is a block diagram essentially similar to the circuit shown in FIG. 6A with the exception of the powering circuit shown to be a known power supply used for AC wiring devices.

FIG. 6A shows a block diagram of the current sensor circuits including the power consumption reporting circuit and the communication circuits of the preferred embodiment of the present invention, using the current transformer shown in FIGS. 2A~2C for powering the current sensor circuits. The circuits including the CPU or analog/digital processor 50, the current signal amplifier 51 and the power supply regulator 57 are the basic circuits for the current sensing and processing including the measuring of the power consumed by a load 58. The load is shown as an ohmic RL, an inductance LL and/or capacitance CL loads and combinations thereof.

The sensing element is the current transformer T1 with its primary coil P consisting of several windings made of a low resistance alloy wire with its thickness selected for a given range of current drain by a load 58. The load is connected between the neutral AC terminal 59 and the load terminal 60 and through the primary coil P of T1 to the live AC terminal 61. The communication circuits include the two way buffer 52 the optical transceiver 56 and the RF transceiver 53.

The current transformer T1 is differently structured from the well known current transformers which commonly include a secondary coil wounded over a toroidal core such as shown in FIG. 1A, for providing a passage or a window for current carrying wire 10 through the center of the core. The current flow through the straight passing wire 10 shown, considered as a single turn, generates magnetic flux that produces a current in the secondary coil S. The current is proportional to the winding turns ratio and will develop a signal voltage output over a load connected to the secondary coil terminals.

The voltage drop over the wire 10 shown in FIGS. 1A~1C is unmesurable because power carrying wires are selected to provide minimum ohmic loss over the power propagating distance. The length of the wire passing the core is few milli meters only. A voltage drop over a micro ohm resistance of a short copper wire is too small and will not change in any significant way if the copper wire is wound onto the core as shown in FIGS. 2A~2C. The voltage drop over the primary coil 11A~11C will be insignificant and far too small to measure. The electrical noise and hum persisting in power lines environment prevent the measuring of micro volts levels, and/or the use of a low milli volt signal reliably.

The secondary current will increase by the windings of the primary coil. The passing straight "single wound" wire provides limited magnetic flux and the several windings increase the flux substantially within the core limitation, such as the core permeability and size.

Further, the commonly used current transformers are specifically made for introduction onto power lines without intersecting the AC wires. This is a concept developed for measuring current in the very high voltage power lines for metering the power consumption, and the meters are away from the power lines and must be totally insulated from the high voltage.

The limitations for the electrical wiring devices, be it in buildings, including factories, warehouses, schools, public places, shops, residences, businesses and others, are that the strict electrical and buildings codes and rules prohibit the connections and/or the mingling of low voltages signaling and/or low voltage power with the electrical wiring devices and/or the electrical wiring.

This mandates the use of RF or optical communications, be it visual light or IR in air or via optical cables such as light-guide, (lightguide is a trademark by Toray Industry of Japan for its plastic optical fiber, known as POF) or fiber optic cable. Yet the RF and the optical communications including the current signal processing circuits must be powered by a low volt and low current power source and this is a hurdle that must be overcome.

The practicality of the electrical wiring devices is their size within the electrical wall boxes. The introduction of current sensors into electrical outlets and light switches presents a size problem. It is difficult to introduce, even a small power transformer to each electrical wiring device including power outlets.

Moreover, it is costly and wasteful to introduce individual power supply be it switching power supply, or analog power supply using a transformer or high voltage AC grade capacitor, for feeding the DC power supply with a reduced AC voltage. It makes no sense particularly when the purpose for the consumption reporting and control is a reduction in the power consumption.

Using the present available techniques for a small size power supplies will end up with noisier electrical environment caused by the as many switching power supplies and/or heated wiring devices by the large relatively power waste resulting from the analog power regulation. The power consumption by the electrical wiring devices will be continuous even though most of the electrical wiring devices are not in use most of the day or at all.

Many outlets remain unused in buildings, homes, businesses and other premises. Considering that the average number of electrical wiring devices in premises are well above 60 per building's unit, the introduction of small power supplies to the 60 devices in millions of premises, with each power supply consumes as little as 1 W/hr. or 24 W/per day, for 365 days/year, will end up with over 500 KW/hr. annually per residence and with Gigawatts power waste for a city or a state. The present invention, changing the way current transformer is designed and used, fully eliminates the wasted power by the unused electrical wiring devices.

The primary coil P of T1 is made of a low ohmic alloy wire such as copper-nickel, silver-nickel, phosphor-bronze or a brass alloy, all are conductors with low resistance that can be made in different wire thicknesses for current up to 30 A or more wound onto a small size ferrite or metal based transformer core, fit for installation into wall boxes of the electrical wiring devices.

The use of a selected low ohmic resistance wire ranging from 0.1 ohm~0.2 mOhm, for sensing current ranging from 8 mA (approx. 1 W in the USA or 2 W in Europe) and up to 30 A (approx. 3.6 KW in USA or 6.9 KW in Europe). Current sensors for loads of 3 KW and over are not commonly used in residences and can be of a larger physical size. The shown values are to enhance the level and the extent to which a small current transformer of the present invention can be used.

The voltage drop over a 1 ohm resistance by a 1 W consuming appliance draining a current of approximately 8 mA through a 3 turns primary coil, will be 8 mV.

The VCC shown in FIG. 6A has to provide, for example, 3.3V/2 mA for operating the processing circuits shown in FIG. 6A. For the 3.3V/2 mA, a secondary coil made of 0.07 mm diameter wire (adequate for up to 6 mA) and a given number of winding turns to output, for example, 5~6 VAC to provide for a regulated 3.3 VDC by the voltage regulator 57.

If the ratio of the primary to secondary winding turns needs to be, for example, 1:750 it is preferable to add some turns and make a ratio such as 1:850 to provide for core losses, secondary winding losses (some 50Ω) by the 2500 winding turns (0.1V loss at 2 mA) and other known transformer losses. It is clear that a load consuming a low 1 W power can generate the 12 mWAC for the DC power needed to operate the current sensor shown in FIG. 6A.

On the other end, a 1 ohm resistance and the 2500 secondary turns will be too large even for a 10 W load, as the current drain will be 80 mA raising the voltage drop to 80 mV. Even though the heat dissipation over the primary coil (0.08 A×0.08V) is an acceptable power waste of 6.4 mW, the voltage developing over the secondary coil (0.08V×850 turns ratio) is in the range of 30 VAC (loaded) and it is too high for the 3.3V analog regulator 57 and a lower secondary output voltage is needed. The solution shown in FIG. 7A provides cascading secondary coils or taps to the secondary coil S and a controlled output selector.

Figure 6C:
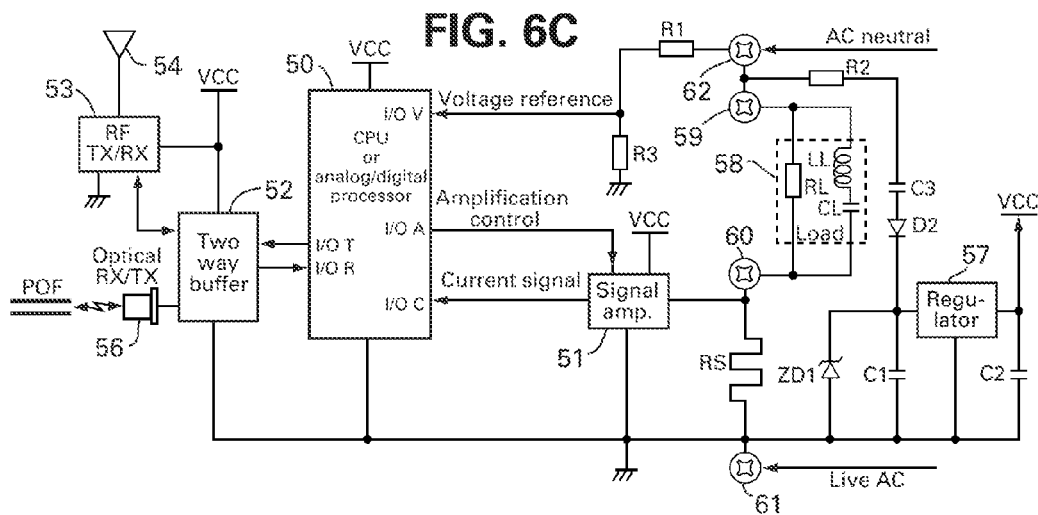
FIG. 6C is a block diagram of the other preferred embodiment of the present invention, essentially combining the circuit of FIGS. 6A and 6B and include a current sensor made of metal alloy and formed into an AC plug or socket or both.

FIG. 7A will be discussed later, but it is clear that the introduction of a resistance in the magnitude of 1 ohm to the primary coil is too large and a smaller resistance is needed. With smaller resistance the powering circuit shown in FIG. 6A will be limited to a higher current range, particularly when a very small power consumption in the range of 1 W or less and up to 20 W, or 60 W or even up to 100 W. For small power consumption sensors the DC power circuit of FIGS. 6B and 6C showing the other preferred embodiments of the present invention will preferably apply.

FIG. 6B is a block diagram with circuit essentially similar to the block diagram of FIG. 6A with the exception of the VCC power supply source, and the use of the secondary coil for outputting current sensing signal instead of the AC power source for the VCC. The VCC power source in FIG. 6B is fed via the protection resistor R2, the capacitor C3 and the diode D2 to the input or terminal of the DC regulator 57.

The regulator 57 shown is the well known analog voltage regulator IC available by many IC manufacturers at very low cost. The shown regulator input circuit includes the filter capacitor C1 for providing low rippled DC input to the regulator and a zener diode ZD1 for protecting the regulator from voltage surges, commonly affecting the electrical systems. The output of the regulator includes a storage capacitor C2 for maintaining sufficient charge to power the current sensor circuits when power is randomly cut, in order to report such random cut to the system controller.

The live AC line is shown connected to the ground which is also the negative line of the VCC. The VCC shown is, for example, as a positive 3.3V, but can be 5V or 1.8V or any voltage commonly applied to a CPU and other ICs, including communication ICs, such as shown in FIGS. 6A~6C and 7A~7B.

As the live AC is connected to the negative pole of the DC supply, the power feed into the input terminal of the voltage regulator 57 is connected to and fed from the neutral AC line to the rectifying diode D2 via the series capacitor C3, an AC grade capacitor, and depending on the power line voltages, may range from, 0.1 micro farad for the 230/240 VAC (EU, UK) and up to 0.18~0.22 micro farad for 100/120 VA (Japan/US) also considering the power frequency 50 Hz or 60 Hz respectively.

The capacitor C3 rated at 275 VAC is well known and is approved by all known standard approving entities such as UL, VDE, JIS and BS for use in electrical power circuits. The resistor R2 between the capacitor C3 and the neutral AC line is a protection resistor to prevent surges and/or may be a self-destructive resistor to prevent fire in the remote event that a short circuit or heavy leakage will occur.

The current transformer TB is similar to the transformer shown in FIGS. 1A~1C, but the primary or the straight wire or a bar 10 is made of low ohmic alloy to increase the voltage drop over the primary terminals. Moreover it can be coiled around the core, similar to the primary 11A~11C shown in FIGS. 2A~2C to increase the magnetic flux and signal level of the secondary SB coil which is needed to overcome the persisting electrical noise. This is to increase the very low output signal levels generated by the small current transformer when a low current in a range of 1 mA~500 mA is drained by a load through the primary wire or coil 10.

The signal amplifier 51 is the well known linear amplifier or dual amplifiers IC, connected in series for amplifying the secondary output signal. The amplifier 51, combining two amplifiers also known as operational amp. or op. amp., with each amp is set to amplify by, for example, up to a factor of 100 and the two in the series can therefore provide up to 10,000 amplification factor. The linear amplifying of the signals generated by the 1~500 mA drain will be well within the linear range of the amplifier 51.

The CPU (Central Processing Unit) or analog/digital processor 50 hereafter referred to as CPU includes analog to digital and digital to analog converter ports, digital ports and analog ports.

The CPU 51 is a commonly available CPU, such as 8 bit or 16 bit low cost, low power consuming processor including a memory. The CPU operates on 1.8V or 3.3V, with an operating current such as less than 1 mA and a sleeping current of few micro Amperes.

The amplified current signal is fed from the amplifier 51 to the port I/OC and based on the amplification control status and the data pertaining to the converted analog current signal to digital, the CPU, is programmed to adjust via the I/O A port the amplification factor of the amplifier 51 to obtain the optimum amplification as programmed, commensurate with the received signal to be in mid or most linear range of the sensor specified range.

As shown in FIGS. 6A~6C and 7A~7B and referred to above, the load 58 is not a pure ohmic or a resistance load, it may be a motor and/or a capacitor and/or a switching power supply commonly used with electrical appliances including PCs. Non ohmic loads cause a shift in phase between the voltage curve and the current curve and/or distort the curve by high power digital switching power loads. FIG. 8 shows two sinusoidal curves, the voltage curve 80~86 and the current curve 90~96, which are shifted by a random angle, caused by an unknown RL, LL, and CL load.

The voltage curve 90~96 is curve of a reference voltage fed to the I/OV of the CPU from the neutral AC terminal 62 via a large ohmic divider R1 and R3, with R1 value is in a range such as 0.5~1.0 Mohm and R3 value is few Kohm, to provide an optimum reference signal level representing the power line voltage, the 120V/60 Hz of the US or the 230V/50 Hz of the European power line. The current curve 90~96 is the amplified current signal and an accurate reference of the current drain value.

A zero crossing 80 of the reference voltage curve is the start position or point in time for the processing of power consumption reading. The current phase shift is evident from the deviation of the zero crossing of the current curve.

The zero crossing 80 shown is the cross from negative to positive, at that same time, the start position time 90, the current curve is shown to be close to the peak of the negative curve, or at a phase shift of more than 90°.

The processing shown in FIG. 8 is the measuring of the five reference cycles 81~85 and the phase shifted five current cycles 91~95. The measuring positions or points in time are shown in FIG. 8 as ten points randomly spread over the voltage curve as 81-1, 82-1, 83-2, 84-3 and 85-4 for the voltage points of time, with the exact point of times over the current curve shown as 92-4, 93-5, 94-6 and 95-8. The end of processing positions or point of times are shown as 86 and 96. The shown time interval is 2 mSec for 50 Hz and 16.6 mSec for 60 Hz. The vertical lines divide one cycle into ten points of time, therefore the interval between each point of time is the time duration of one cycle divided by 10.

The time interval or the number of measure points during one cycle (Hz) directly relates to the accuracy of the measurement, same applies to the number of measured AC cycles in one measuring round. Both are a decision to be made, in which higher accuracy require more measured AC cycles (Hz) in one measuring round and a decrease in time intervals or an increase in the number of measuring point.

The power consumption is the product of a calculated sinusoidal V×A graphs created on the basis of the measured values at each point of time simultaneously and summed up per each cycle on the basis of the voltage referenced timing. The shown five cycles 81~85 in FIG. 8 are an example of one round of measurement repeated, for example, every two seconds. When a calculation round is programmed to be carried every two seconds the total of five measured cycles will be multiplied by a factor of 20 for 50 Hz and 120 for 60 Hz (50:5/sec.×2 sec.) or (60:5/sec.×2 sec.). This will represent the power consumed in two seconds.

By the above it should be obvious that the power consumption calculation by the current sensors of the present invention can be simplified and performed by a low cost Central Processing Unit (CPU) or an analog/digital processor both are available from many IC manufacturers. It should be also obvious that the current sensor of the present invention can be made small in size, fit into AC plugs, plug-in current sensors, AC outlets and other electrical wiring devices and provide accurate, practical and low cost solution to the power consumption reporting.

The calculated power consumed values are stored and updated in the memory included in the CPU for reporting as programmed to a controller. The calculated power consumption value is converted into a predefined programmed protocol that includes particulars of the load or appliance and the location of load and/or of the AC outlet. The stored and updated data in the memory are the coded protocols.

The referenced patents, publications and application, particularly application Ser. No. 13/086,610 discloses the coding of power consumption protocols and the signal structure of the protocol reporting. The command structure is designed to be short command comprising five bytes only that include all the necessary data for reporting power consumption, the load particulars and its location.

The short command is necessary particularly when the load is switched off thereby cutting the power to the sensor circuits, so as to minimize the charged storage capacitor C2 drain, when the current sensor reports the load new status or "a load switch off" protocol. This is important as the optical LED transmitter drains several mA such as 5~6 mA and a storage capacitor to cover responses for several communications, such as responding to inquiry from a controller when the power is cut (no load current) will require very big capacitance and an increased size.

The RF transmitter output measured commonly in micro watt units, does not consume much power, however, it is preferable to minimize the length of the reporting protocols. The shown two transceivers the RF 53 and the optical 56 are not needed in pairs. Systems operating on RF may not include the optical transceiver 56 and systems operating through optical network may not include the RF transceiver 53. Regardless it is possible to include both in the circuit and operate wireless and optical network in parallel.

The two way buffer 52 is a well known amplifier-buffer, available in small surface mounted IC packages from many semiconductor manufacturers. Its purpose is to interface the signals and their levels and feed the two way signals between the transceivers 53 and 56 to the CPU 50 I/O T and I/O R ports. Depending on the selected CPU and the analog/digital processor 50 there are many such devices that include I/O ports that require no additional buffer as they can be programmed to output and receive varying signals commensurate with the signal exchanged between the CPU and the transceivers. For such devices the two way buffer 52 is not needed and is not used.

The block diagram of FIG. 6B is similar to the block diagram and the circuit of FIG. 6A with the exception of the power supply and the sensing transformer TB. The transformer TB as explained above uses the low ohmic wire for its primary coil or straight through wire 10 and applies its secondary SB output signal generated by the TB in response to current drain via the primary coil or wire 10.

The block diagram of FIG. 6B is a preferred embodiment for low current consumption load such as up to 100 W for use in small plug-in current sensor adaptor similar to the shown in FIG. 3B.

FIG. 6C is literally identical block diagram with FIG. 6B with the exception of the current transformer 6B that is replaced by the structured terminal RS made of low ohmic alloy for providing voltage drop that is used for measuring the current drain through a terminal such as 21, 31 or 41 of FIGS. 3A, 4A and 5A. All other circuits are identical with the circuit of FIGS. 6A and 6B. The power supply circuit is identical with the power supply of FIG. 6B explained above.

FIG. 6C is provided for higher currents and higher power consumption reporting, as the structured terminal and the selection of alloy material and thickness make it feasible to drain via the terminal currents of 30 A and over. The heat remains well within the well below 1 W by the power waste over the low ohmic resistor, and is dissipated via the plugs contacts. It is clear that the use of low ohmic alloys in current sensing devices and components provide whole new prospects to the introduction of low cost, reliable and easy to handle power consumption reporting devices.

FIG. 7A shows the block diagram of FIG. 6A modified to include the current transformer T11 with multi n winding or n taps for enabling to extend the current sensing range, as explained above from low current drain of few mA and up to several amperes. The taps A, B, C and n are shown to feed their rectified output, rectified by the diodes D1, 2, 3 and n and filtered by the capacitors C11~n to I/O ports I/O 1~I/O n of the CPU 50A with expanded I/O ports and to a selector 63. The output selector 63 can be a low cost multi input analog multiplexer known as analog switch and available from many IC manufacturers, such as Maxim, JRC, Texas Instrument and many more.

Even though such multiplexers are designed for signals selections, the signals are specified to be 18V and over with current of 25 mA and over, well above the few mA DC fed from each tap of the secondary coil S, with voltages well below the 18V or the 25V that are common for such analog switch or multiplexer 63. The I/O S of the CPU control the multiplexer via its control terminal to select the lowest voltage that the CPU has measured to be above a given level as programmed by connecting the identified output A, B, C or n through the multiplexer output terminal to the regulator input.

The default setting for the multiplexer control is tap A that outputs the highest voltage, it is the output or tap designed to provide sufficient power for the lowest current drain via the primary P. The mid-range current is designed or assigned to tap B, and the highest range current of the example shown is the tap C. The tap n is the over current drain output.

It should be obvious that only output A can reach the AC level output designed for the lowest current drain of the current sensor range. When the current drain through the primary is in the mid-range of the specified current sensing, both taps A and B will output voltage levels exceeding the programmed level, with the voltage of tap A will be well above the programmed level. For this reason the level select will connect the multiplexer input B with the output for feeding power to the regulator 57. Same will apply to the maximum specified current drain, wherein input C will feed through the multiplexer its power to the regulator 57.

In the event of over current drain through the primary coil P the tap n will feed via the input n its power to the regulator 57 and at the same time the CPU will alert the controller of the system of the over current detection and/or will sound a buzzer of flash an LED (not shown) to alert the user of the system to take corrective measures, or switch off the load.

Outside the extensions of the current sensing range by the multi tap solution, the circuits in FIG. 6A and FIG. 7A and their block diagram are identical and they operate the same way through the amplification control, the power consumption processing and reporting. Shown in FIG. 7A are three secondary output taps and depending on the specified current sensing range, the operating environment and the loads selections, any number of taps can be introduced.

For larger current sensors, be it plug-in type, AC outlet type or plug type as used for heavier load, such as with 50 A, the use of the low ohmic alloys is preferable. For such heavy currents an industrial type of an AC outlet with current sensor or high power plug with current sensor or a plug-in current sensor similar to the shown in FIG. 3B but bigger in size to accommodate larger terminals or larger current transformer bodies embodying the present invention can be used, instead of the structured terminal with a resistance element made of low ohmic alloy shown in FIGS. 3B, 4B and 5B.

Figure 7B:
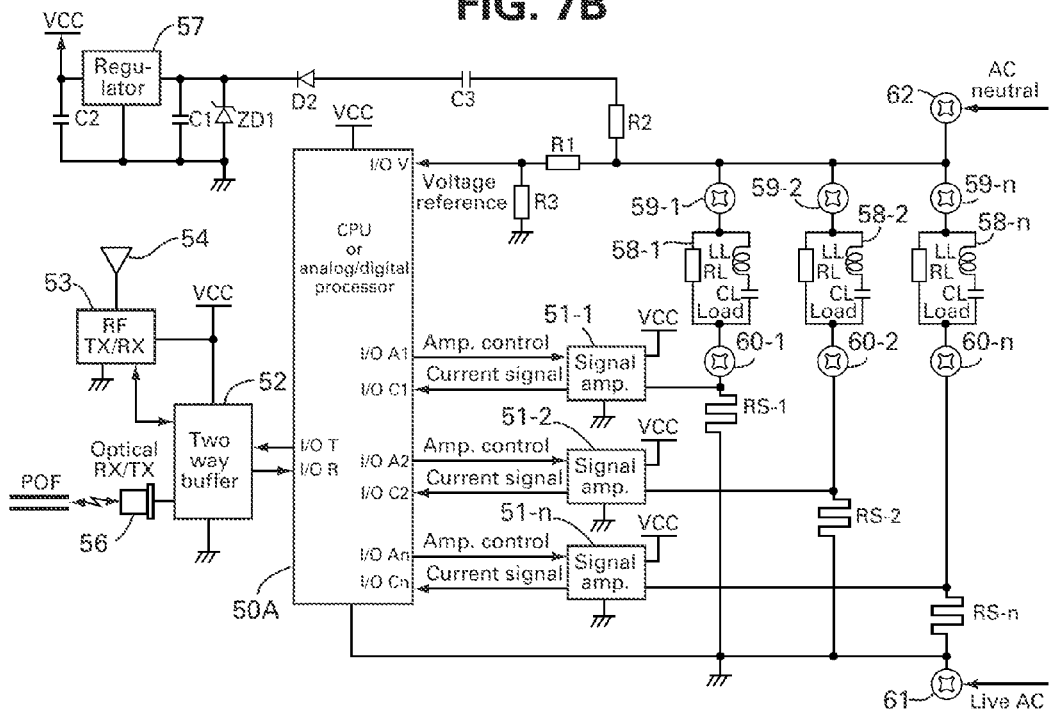
FIG. 7B is a block diagram similar to FIG. 6C expanded to provide a combined circuit for current sensing of a plurality of AC outlets and other AC wiring devices.
Figure 8:
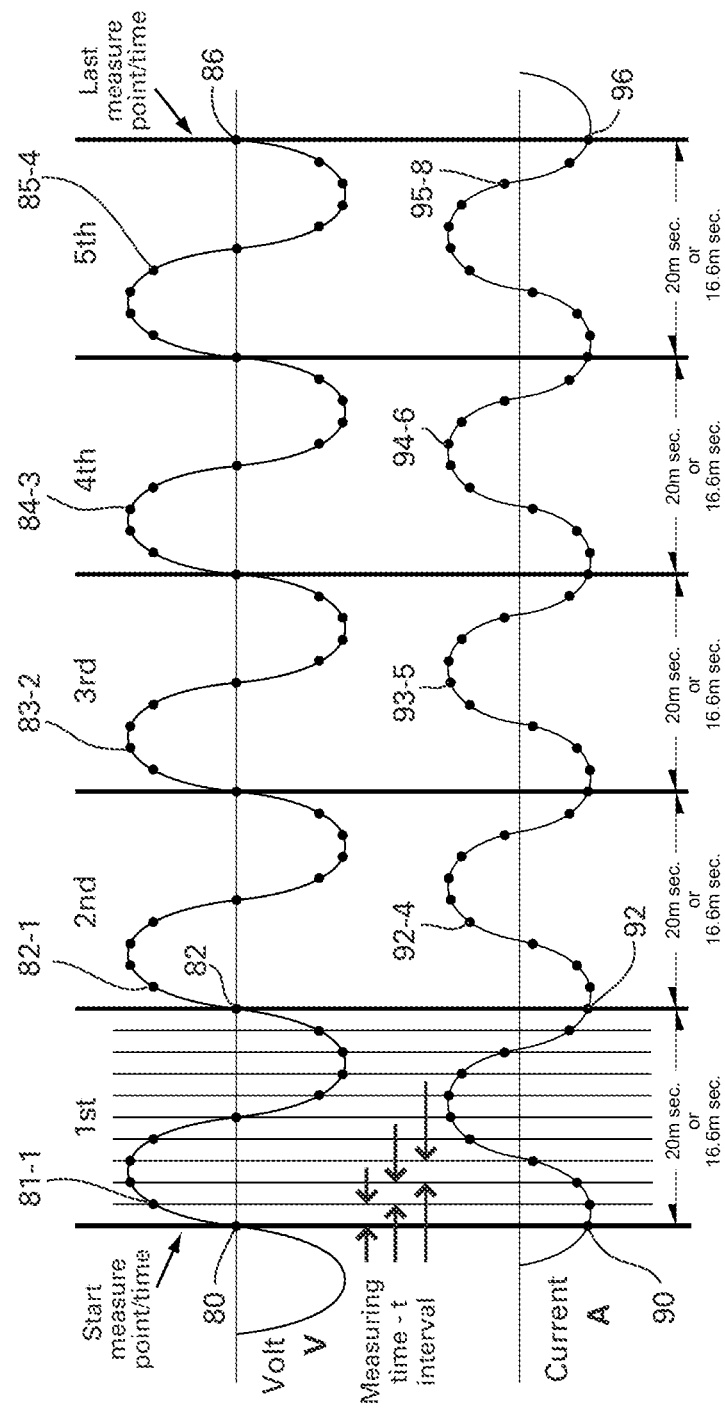
FIG. 8 is a graph showing the AC current and voltage phase shift wave forms and the timed measuring positions for calculating the actual power consumption.

FIG. 7B shows a block diagram similar to the block diagram of FIG. 6C with the exception of the multi current sensing circuits for multi AC power outlets and/or for AC outlets adaptors and cable assemblies extenders with plurality of AC outlets. The basic circuit of FIG. 7B is identical with the circuit shown in FIG. 6C, using the structured resistors of the live AC terminal made of low ohmic alloy RS.

The difference is the adding of n outlets for n loads with each of the terminal socket includes its structured resistor shown as RS-1, RS-2 and RS-n. The expanded CPU 50A provides for each structured resistor RS-1, RS-2 and RS-n to feed it output to an amplifier 51-1, 51-2 and 51-n that its amplification is controlled by I/O A-1, I/O A-2 and I/O A-n respectively.

By this circuit arrangement it becomes obvious that a single combine expanded circuit can be used for a multi AC outlets of a single electrical wiring device or for an adaptor with multiple outlets (not shown) or for a cable assembly extender with plurality of AC outlets (not shown), wherein each outlet will provide for sensing its current drain and individually report its power consumption.

The reporting of power consumption to a controller directly or via a network device, such as a current data receiver that receive RF signals or optical signals via an optical cable, must include identifying data. The data should include an identification of the load 58 or the appliance or the type of or the family of the appliance.

The data should further include the location of the appliance within the premise, be it an apartment, or a shop, or a school, or a factory. It is preferred that the data includes the specific identification of the AC outlet, or to which current receiver the outlet is connected or reporting to.

As referred to above the use of current transformer to power the circuit mandate the use of a storage capacitor, the capacitor C2 referred to above for providing sufficient capacity for powering the transceivers, particularly the optical transmitter or the LED that consumes a current in a range such as 5 mA~6 mA. Moreover, the capacitor has to store sufficient electric charge to transmit a data when the power is cut, or preferable to store sufficient charge to respond to at least one inquiry by a controller after the power was cut, or the load was switched off.

Another important factor to minimize the drain of the stored charge in C2 is the length of the reporting time and the data content and structure. The data loading methods, be it via rotary switches, or via RF, IR or optical download signals are all disclosed in the referenced patents, publications and application referred to above. The very short data content and structure is disclosed in the referenced application Ser. No. 13/086,610, all the patents, publications and applications are incorporated herein by reference.

Such short data disclosed in the referenced application Ser. No. 13/086,610 structured to five bytes only that include the location, the appliance identification, the power consumed, addressing and other needed data for the processing of the reporting and/or the receiving of an inquiry, such as start bit, end bit, check sum and the nature of the command.

Having all these details in a predefined protocol covering the whole range of appliances, from all the rooms and common zone of a residence, provide the simplicity and standardization for management of the electricals and the appliances used in residences. The time duration for the preferred reporting is 20 mSec and the DC current drained for the processing and propagating one command (when the power is cut) is 5~6 mA.

The time duration of 20 mSec for the reporting of the current drain or the power consumption by the current sensor of the present invention is when the communication is slow at a rate of 900~1200 Baud. The DC current drain during the optical transmission is 5~6 mA, and during RF transmission is 2~3 mA. The receiving of an inquiring protocol for the power consumption or the status of a load will drain an approximate of 1 mA, regardless if it is an RF or an optical inquiring protocol. This mandates a capacitor that can store a charge equivalent to a maximum of 6 mA over duration of 60 mSec or 0.06 sec, and a small surface mounted 200~470 micro Farad electrolytic or tantalum capacitor, rated at 6.3V is suffice.

It becomes clear that the use of alloy wires into current transformers and alloy materials for structured power pins, sockets and combination thereof together with the powering solutions for operating the current sensors and the power consumption reporting of the present invention provide for a new generation of low cost current sensors that waste no or very little power, are simple to manufacture, install and use.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the spirit and scope of the invention.

What is claimed is:

1. A method for sensing AC current drain through a structured current sensor made of a low ohmic metal alloy by a load attached to an electrical device selected from a group comprising AC outlet, AC plug, AC current sensing unit and AC current sensing adaptor, each including said current sensor structured into a portion of at least one of a terminal selected from a group comprising a power pin, a power socket, AC terminal and a combination thereof for connecting and conducting the current drawn by said load through said terminal and said structured current sensor, said electrical device further comprising a CPU and a current signal amplifier for amplifying a voltage drop developing over said current sensor, said method comprising the steps of:

a. attaching a load to said AC device;
b. operating said load;
c. feeding the voltage drop developing over said current sensor made of low ohmic metal alloy to said amplifier,
d. amplifying said voltage drop signal; and
e. feeding the amplified signal to said CPU for processing.

2. The method according to claim 1, wherein said CPU is fed with a voltage reference of said AC power for processing said amplified current drain signal coinciding with said reference for deriving the power consumed by said load.

3. The method according to claim 2, wherein said electrical device further comprising at least one of an RF transceiver and an optical transceiver for communicating a processed data pertaining to at least one of the current drained and the consumed power via at least one of in air and through an optical cable respectively.

4. The method according to claim 3, wherein said structured portion is made to fit a size, a shape and a given low ohmic value for developing a voltage drop commensurate within one of a given current drain values and range.

5. The method according to claim 4, wherein said power socket is structured with a plurality of sockets for use in a multi AC power outlet, each said socket includes one said structured portion for connecting and feeding a voltage drop to an input of one of a plurality of current signal amplifiers;

connecting each output of said plurality of amplifiers to one port of a plurality of ports included in said CPU, said terminal is connected to an AC power source, said method comprising the further steps of:
a. connecting each said socket to one load of a plurality of loads;
b. operating said loads;
c. feeding each voltage drop pertaining to each load to one of said plurality of amplifiers;
d. amplifying said each voltage drop signal;
e. feeding the individually amplified signals to said CPU;
f. processing each individual amplified signal coinciding with said reference for deriving the power consumed by one of each said load individually and a combined power consumed by said plurality of loads; and
g. communicating a processed data pertaining to at least one of the current drained and the consumed power via at least one of each said socket and the plurality of sockets via at least one of in air and through an optical cable respectively.

6. The method according to claim 4, wherein said current sensor is said structured portion of a combination of said power pin and power socket used in said AC current sensing adaptor.

7. The method according to claim 1, wherein said structured portion is made to fit a size, a shape and a given low ohmic value for developing a voltage drop commensurate within one of a given current drain values and range.

8. The method according to claim 7, wherein said electrical device is enclosed in one of a body and a cover with a visible color coded ratings selected from a group comprising a power consumption range, a power consumption value, a current drain range, a current drain value, a power voltage range, a power voltage value, a colored front cover, a colored rear cover, a colored frame, a colored whole body and combinations thereof.

9. The method according to claim 7, wherein said power socket is structured with a plurality of sockets for use in a multi AC power outlet, each said socket includes one said structured portion for connecting and feeding a voltage drop to an input of one of a plurality of current signal amplifiers;

connecting each output of said plurality of amplifiers to one port of a plurality of ports included in said CPU, said terminal is connected to an AC power source, said method comprising the further steps of:
a. connecting each said socket to one load of a plurality of loads;
b. operating said loads;
c. feeding each voltage drop pertaining to each load to one of said plurality of amplifiers;
d. amplifying said each voltage drop signal; and
e. feeding the individually amplified signals to said CPU for processing.

10. The method according to claim 9, wherein said electrical device is enclosed in one of a body and a cover with a visible color coded ratings selected from a group comprising a power consumption range, a power consumption value, a current drain range, a current drain value, a power voltage range, a power voltage value, a colored front cover, a colored rear cover, a colored frame, a colored whole body and combinations thereof.

11. An apparatus for sensing AC current drain through a structured current sensor made of a low ohmic metal alloy by a load attached to an electrical device selected from a group comprising AC outlet, AC plug, AC current sensing unit and AC current sensing adaptor each including said current sensor structured into a portion of at least one of a terminal selected from a group comprising a power pin, a power socket, AC terminal and a combination thereof;

said electrical device further comprising a CPU and a current signal amplifier for amplifying a voltage drop developing over said current sensor by the current drawn by said load and feeding an amplified current signal to said CPU for processing.

12. The apparatus according to claim 11, wherein said CPU is fed with a voltage reference of said AC power for processing said amplified current drain signal coinciding with said reference for deriving the power consumed by said load.

13. The apparatus according to claim 12, wherein said electrical device further comprising at least one of an RF transceiver and an optical transceiver for communicating a processed data pertaining to at least one of the current drained and the consumed power via at least one of in air and through an optical cable respectively.

14. The apparatus according to claim 13, wherein said structured portion is made to fit a size, a shape and a given low ohmic value for developing a voltage drop commensurate within one of a given current drain values and range.

15. The apparatus according to claim 14, wherein said power socket is structured with a plurality of sockets for use in a multi AC power outlet, each said socket includes one said structured portion for connecting and feeding a voltage drop to an input of one of a plurality of current signal amplifiers;

each output of said plurality of amplifiers is connected to one port of a plurality of ports included in said CPU for feeding the individually amplified current drain signal for processing each individual amplified signal coinciding with said reference for deriving the power consumed by one of each said load individually and a combined power consumed by said plurality of loads;

a processed data pertaining to at least one of the current drained and the consumed power via at least one of each said socket and the plurality of sockets is communicated via at least one of in air and through an optical cable respectively.

16. The apparatus according to claim 11, wherein said structured portion is made to fit a size, a shape and a given low ohmic value for developing a voltage drop commensurate within one of a given current drain values and range.

17. The apparatus according to claim 16, wherein said current sensor is said structured portion of a combination of said power pin and power socket used in said AC current sensing adaptor.

18. The apparatus according to claim 16, wherein said electrical device is enclosed in one of a body and a cover with a visible color coded ratings selected from a group comprising a power consumption range, a power consumption value, a current drain range, a current drain value, a power voltage range, a power voltage value, a colored front cover, a colored rear cover, a colored frame, a colored whole body and combinations thereof.

19. The apparatus according to claim 16, wherein said power socket is structured with a plurality of sockets for use in a multi AC power outlet, each said socket includes one said structured portion for connecting and feeding a voltage drop to an input of one of a plurality of current signal amplifiers, each output of said plurality of amplifiers is connected to one port of a plurality of ports included in said CPU for feeding the individually amplified current drain signal for processing.

20. The apparatus according to claim 19, wherein said electrical device is enclosed in one of a body and a cover with a visible color coded ratings selected from a group comprising a power consumption range, a power consumption value, a current drain range, a current drain value, a power voltage range, a power voltage value, a colored front cover, a colored rear cover, a colored frame, a colored whole body and combinations thereof.

* * * * *